(12) United States Patent
Asbeck et al.

(10) Patent No.: US 12,308,798 B2
(45) Date of Patent: May 20, 2025

(54) ADAPTIVE BIAS CIRCUITS AND METHODS FOR CMOS MILLIMETER-WAVE POWER AMPLIFIERS

(71) Applicant: The Regents of the University of California, Oakland, CA (US)

(72) Inventors: Peter M. Asbeck, Del Mar, CA (US); Sravya Alluri, San Diego, CA (US); Narek Rostomyan, La Jolla, CA (US); Seyed Bagher Rabet, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 736 days.

(21) Appl. No.: 17/572,971

(22) Filed: Jan. 11, 2022

(65) Prior Publication Data

US 2022/0416726 A1 Dec. 29, 2022

Related U.S. Application Data

(60) Provisional application No. 63/139,398, filed on Jan. 20, 2021.

(51) Int. Cl.
*H03F 3/195* (2006.01)
*H03F 1/02* (2006.01)
(Continued)

(52) U.S. Cl.
CPC ............ *H03F 1/0288* (2013.01); *H03F 1/56* (2013.01); *H03F 3/195* (2013.01); *H03F 3/245* (2013.01); H03F 2200/451 (2013.01)

(58) Field of Classification Search
CPC .......... H03F 1/0288; H03F 1/56; H03F 3/195; H03F 3/245; H03F 2200/451;
(Continued)

(56) References Cited

U.S. PATENT DOCUMENTS 9,035,697 B2 * 5/2015 Youssef ................ H03F 1/3205
330/311

OTHER PUBLICATIONS

Kuo et al., "K-Band CMOS Power Amplifier with Adaptive Bias for Enhancement in Back-off Efficiency", 2011 IEEE MTT-S International Microwave Symposium, 2011, pp. 1-4, IEEE.
(Continued)

*Primary Examiner* — Andrea Lindgren Baltzell
*Assistant Examiner* — Khiem D Nguyen
(74) *Attorney, Agent, or Firm* — Greer, Burns & Crain, Ltd.; Steven P. Fallon

(57) ABSTRACT

Adaptive bias networks include small transistors connected to adjust gate bias voltage of one or more transistors of an amplifier or amplifier stage, or in a main or auxiliary path of a compound amplifier such as a Doherty amplifier. The small transistors are sized to avoid additional loading of the input. The adaptive bias circuits of preferred embodiments adjust the gate bias to produce a boost in gate bias voltage of an nFET transistor when the input power is in an upper portion of the amplifier or amplifier stage's input power range, thereby increasing the gain, and reduce gate bias voltage of a pFET transistor in the upper portion of the amplifier's input power range, thereby also increasing the gain. The adaptive bias networks can be implemented with varactors to vary DC voltage across the varactor to change its capacitance and compensate changing input capacitance of the amplifier input FET.

15 Claims, 16 Drawing Sheets

(51) Int. Cl.
*H03F 1/56* (2006.01)
*H03F 3/24* (2006.01)

(58) Field of Classification Search
CPC ............... H03F 2200/18; H03F 1/0266; H03F 2200/453; H03F 1/223
USPC .......................................................... 330/277
See application file for complete search history.

(56) References Cited

OTHER PUBLICATIONS

Tsai et al., "Design and Analysis of a 44-GHz MMIC Low-Loss Built-In Linearizer for High-Linearity Medium Power Amplifiers", IEEE Transactions on Microwave Theory and Techniques, 2006, pp. 2487-2496, vol. 54, No. 6, IEEE.

Huang et al., "A K-Band Adaptive-Bias Power Amplifier with Enhanced Linearizer Using 0.18-μm CMOS Process", 2015 IEEE MTT-S International Microwave Symposium, 2015, pp. 1-3, IEEE.

Hsu et al., "A 60 GHz CMOS Power Amplifier with Modified Pre-distortion Linearizer", 2013 IEEE MTT-S International Microwave Symposium Digest (MTT), 2013, pp. 1-4, IEEE.

Yi et al., "Analog Predistortion Linearizer for High Power RF Amplifier", 2000 IEEE MTT-S Digest, 2000, pp. 1511-1514, IEEE.

Lee et al., "A High-Linearity Wideband Power Amplifier With Cascaded Third-Order Analog Predistorters", IEEE Microwave and Wireless Components Letters, 2010, pp. 112-114, vol. 20, No. 2, IEEE.

Rabet et al., "Gate Leakage Current Effects on the Linearity of 28GHz CMOS SOI Power Amplifiers", 2019 IEEE Topical Conference on RF/Microwave Power Amplifiers for Radio and Wireless Applications (PAWR), 2019, pp. 1-4, IEEE.

Rostomyan et al., "15 GHz Doherty Power Amplifier With RF Predistortion Linearizer in CMOS SOI", IEEE Transactions on Microwave Theory and Techniques, 2018, pp. 1339-1348, vol. 66, No. 3, IEEE.

* cited by examiner

ADAPTIVE BIAS CIRCUITS AND METHODS FOR CMOS MILLIMETER-WAVE POWER AMPLIFIERS

PRIORITY CLAIM AND REFERENCE TO RELATED APPLICATION

The application claims priority under 35 U.S.C. § 119 and all applicable statutes and treaties from prior U.S. provisional application Ser. No. 63/139,398 which was filed Jan. 20, 2021.

FIELD

Fields of the invention include radio frequency (RF) power amplifiers and RF power amplifiers for wideband wireless communication systems. An example application of the invention is to the 5G-NR signals, or to 64QAM orthogonal frequency multiple access (OFDM) signals, used in 5G millimeter-wave systems. Additional applications include satellite communication systems, several military communication systems and advanced radar systems that use complex modulations.

BACKGROUND

The variation in gain or phase vs output power (AM-AM or AM-PM distortion) correspond to nonlinear behavior of RF transmitter millimeter wave amplifiers, which causes errors in the transmitted signals. Adaptive bias circuits adjust the gate bias voltage of the transistor (or transistors) in the power amplifier in a manner that depends on the input power of the amplifier, such that the amplifier performance is enhanced. The enhancements provided by the circuits are numerous: 1) The linearity is enhanced by keeping the gain of the amplifier less dependent on input and output power (reduction of AM-AM distortion). 2) The linearity is enhanced by keeping the phase delay of the amplifier less dependent on input and output power (reduction of AM-PM distortion). 3) The reliability of the transistor controlled in this way is enhanced, by reducing the tendency for time-dependent dielectric breakdown (TDDB) at the gate at high output power. 4) The adaptive bias circuits provide a mechanism to mitigate the gain and distortion changes that occur when the amplifier is connected to a load that is not the expected 50 ohms (corresponding to high VSWR); for this case, an external control circuit is needed to govern the adaptive bias circuit reference voltage.

Adaptive bias circuits have been previously developed for use with power amplifiers at low microwave frequencies (for example, 1-2 GHz as applied in 2G, 3G and 4G cellular networks). Direct application of these techniques is not straightforward at higher frequencies, such as 28 GHz as used for 5G wireless communications, because the transistors have less gain at the high frequencies.

Adaptive bias circuits for low frequencies (up to 2 GHz) are known. The vast majority of reported millimeter-wave MOS power amplifiers do not use adaptive bias circuits. There have been several recent reports of adaptive bias circuits for 28 GHz PAs, however. The focus of the adaptive bias circuits has been limited to improvement of efficiency in backoff from full power.

SUMMARY OF THE INVENTION

Preferred adaptive bias networks are implemented via small transistors connected to adjust gate bias voltage of one or more transistors of an amplifier or amplifier stage, or in a main or auxiliary path of a compound amplifier such as a Doherty amplifier. The small transistors are sized to avoid additional loading of the input. The adaptive bias circuits of preferred embodiments adjust the gate bias to produce a boost in gate bias voltage of an nFET transistor when the input power is in an upper portion of the amplifier or amplifier stage's input power range, thereby increasing the gain, and reduce gate bias voltage of a pFET transistor in the upper portion of the amplifier's input power range, thereby also increasing the gain and improving the amplifier AM-AM and AM-PM characteristics. The adaptive bias circuits can also change the DC voltage across a varactor placed in the input impedance matching network of the amplifier, in such a way that the varactor capacitance as a function of amplifier input power compensates for the changing capacitance of the input transistor, and thereby further improves the AM-PM characteristics of the amplifier.

DETAILED DESCRIPTION OF THE PREFERRED EMBODIMENTS

Figure 1:
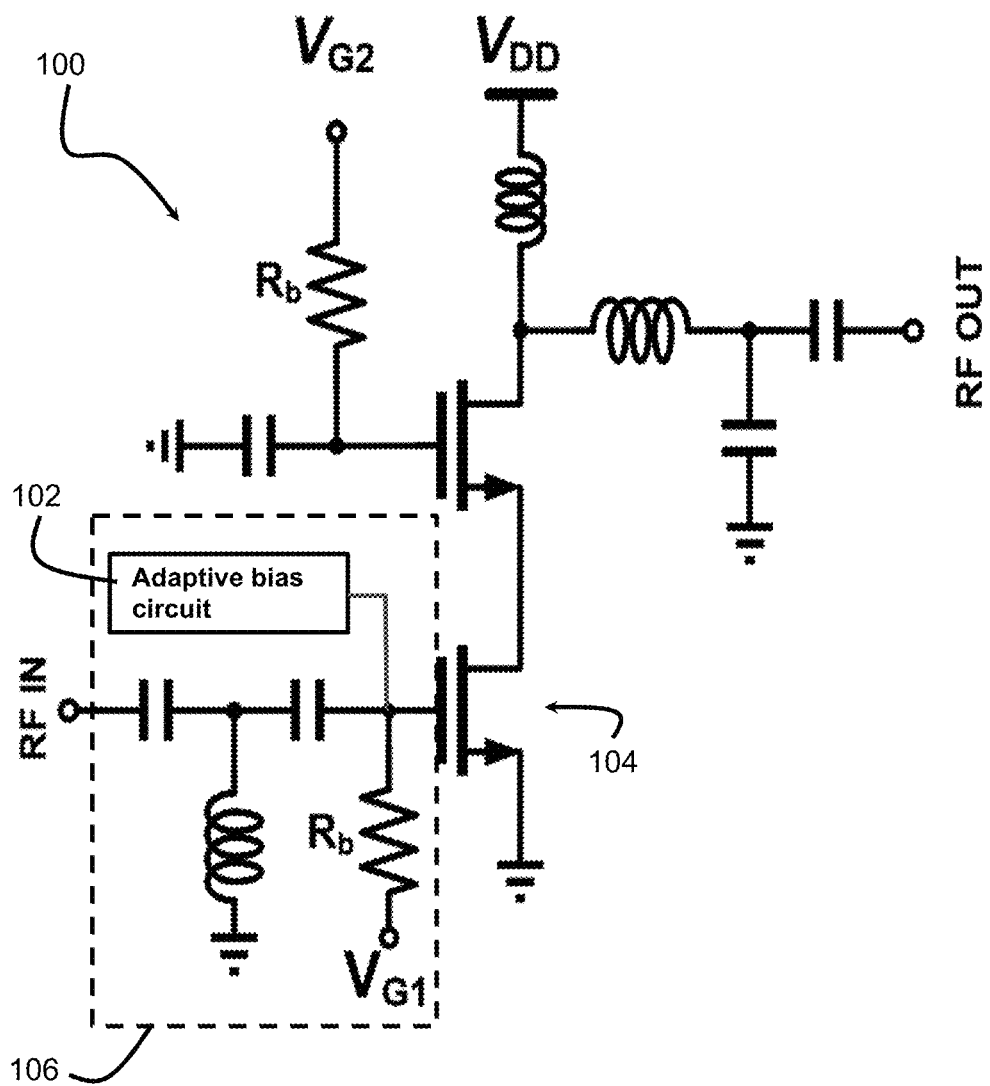
FIG. 1 is a schematic 28 GHz single-stage CMOS-SOI power amplifier circuit including an adaptive bias circuit in accordance with the invention.

Embodiments of the invention include power amplification methods and power amplification circuits that can be incorporated into typical mm-wave amplifier circuits without loading down the input and without decreasing the amplifier gain, while increasing various aspects of amplifier performance, such as linearity and reliability. An example implementation of the invention is a Class AB nMOS power amplifier, modified to include an adaptive bias network that controls the bottom transistor's gate voltage in accordance with the instantaneous input RF power level.

In the present disclosure, in relation to AM-AM and AM-PM correction circuits, an adaptive bias network is a circuit that generates a dc voltage that depends on the microwave power level to be amplified. The input power level can be sensed at the input to the overall amplifier, or in the case of a multistage amplifier, at the output of any of the initial stages of the amplifier. Adaptive bias networks can be constructed using diodes or transistors. Examples discussed below include diode-connected transistors; single transistor stages wherein the transistor is operated in nonlinear mode such as Class B or Class C so that its output current contains a rectified version of the microwave input power; and multiple transistor amplifiers, in which at least one of the stages is operated in nonlinear mode to provide rectification.

Preferred embodiments of adaptive bias networks can be implemented via small transistors connected to adjust gate bias voltage of one or more transistors of an amplifier or amplifier stage, or in a main or auxiliary path of a compound amplifier such as a Doherty amplifier. The small transistors are sized to avoid additional loading of the input. The adaptive bias circuits of preferred embodiments adjust the gate bias to produce a boost in gate bias voltage of an nFET transistor when the input power is in an upper portion of the amplifier or amplifier stage's input power range, thereby increasing the gain, and reduce gate bias voltage of a pFET transistor in the upper portion of the amplifier's input power range, thereby also increasing the gain.

The control of gate voltage provides benefits. Gain flatness near the maximum output power is improved (thus overcoming the "soft saturation" effect that shows up in many CMOS PAs). The phase of the output can also be kept more constant at high power, as demonstrated via representative FETs and amplifier configurations. An additional important benefit for mm-wave CMOS power amplifiers is that the adjustment of gate bias reduces a maximum drain to gate voltage experienced by the controlled transistor and as a result decreases the degradation process of time dependent dielectric breakdown (TDDB) that is an important limiter to the performance of mm-wave CMOS power amplifiers.

Adjustment of the reference dc voltage of the adaptive bias circuit can alter the gain and phase profiles that become degraded when the output load deviates from its designed value, e.g., 50 ohms. A typical application of an adaptive bias circuit of the invention is to the gate of an input transistor in an amplifier or an amplifier stage. Multiple adaptive bias circuits can be used for the different transistors of compound amplifiers. For example, in a Doherty amplifier, there are transistors (often several of them) in the main path and in the auxiliary path. The overall linearity of the Doherty amplifier can be adjusted with the use of multiple adaptive bias circuits controlling the transistor biases.

The adaptive bias circuits sense the input power to the amplifier (or to the final stage transistor that must be controlled) and then adjust the "dc" bias on the gate of the transistor, in general boosting the bias voltage when the input power is high (for an nFET; and reducing for a pFET, i.e., the corresponding bias voltage would be decreased).

For modulated input signals with time-varying "instantaneous" power, the gate bias adjustment follows the "instantaneous" input power. This is beneficial in terms of linearity because it increases the gain at power levels when the amplifier begins to saturate (where the gain ordinarily becomes compressed). We have also determined—by simulation and experiment—that the present adaptive bias circuits can decrease the phase shift of the output, minimizing the AM-PM distortion. Another effect that is important in high efficiency mm-wave amplifiers is that the adaptive bias circuit decreases the time-dependent dielectric breakdown process which can limit the maximum power the amplifier can handle. The TDDB mechanism operates as follows: for the Class AB bias condition that is generally used, when the input power gets large, there is a large voltage swing on the gate, in both positive and negative directions. Within the amplifier operating with an n-channel transistor, when the gate goes negative the transistor's drain voltage goes positive—and as a result a large voltage between drain and gate can develop. When this voltage becomes too large, the transistor's gate oxide begins to degrade through TDDB. With preferred bias circuits, the dc voltage of the gate increases, to counter the negative excursion of the gate during the RF cycle.

Methods and circuits of the invention have widespread applicability to power amplifiers in modern wireless transmitter circuits. The invention has particular applicability to mm-wave transmitters employing antenna arrays and using modulated output signals that require high linearity. In such systems, it is generally not cost effective to provide digital predistortion capability for each power amplifier—thus the power amplifier must be linear on its own. The linearity improvement provided with the adaptive bias circuits described here is a significant benefit. It allows operation without the large backoff power levels needed with conventional amplifiers while still maintaining required system linearity, and thus can provide higher power and efficiency for the system. Systems that can directly benefit are 5G wireless communication systems, satellite communication systems, several military communication systems and advanced radar systems that use complex modulations.

A technique is described to improve the performance of RF amplifiers operating at frequencies above 20 GHz by the use of adaptive bias networks, which adjust the gate bias of one or more amplifying FETs according to the value of the input power level, leading to a reduction of the amplifier AM-AM and AM-PM distortion and/or an enhancement in reliability. Various embodiments of adaptive bias network designs are described. The adaptive bias networks can be used in conjunction with varactors to reduce AM-PM distortion, by varying the DC voltage across the varactor in a manner that will change its capacitance in order to compensate the changing input capacitance of the amplifier FET. A description is given of the design of the adaptive bias networks in order to avoid the introduction of "memory effects" that can distort the output of modulated signals with high bandwidth.

Preferred embodiments of the invention will now be discussed with respect to experiments and drawings. Broader aspects of the invention will be understood by artisans in view of the general knowledge in the art and the description of the experiments that follows.

FIG. 1 shows a preferred Class AB nMOS power amplifier 100 with an adaptive bias circuit 102 that is applied to the gate of the bottom nMOS transistor 104 in a two-transistor stack. The adaptive bias network 102 forms part of the input matching network 106 of the power amplified. The adaptive bias circuit 102 adjusts the DC gate voltage of the bottom transistor 104 so that it increases in a desired fashion as the instantaneous input RF power level increases. Conventionally the bias DC voltage is set by $V_{G1}$, a fixed value, whereas with the adaptive bias network, the bias voltage is boosted for an upper portion of the amplifier or amplifier stage's input power range.

Figure 2A:
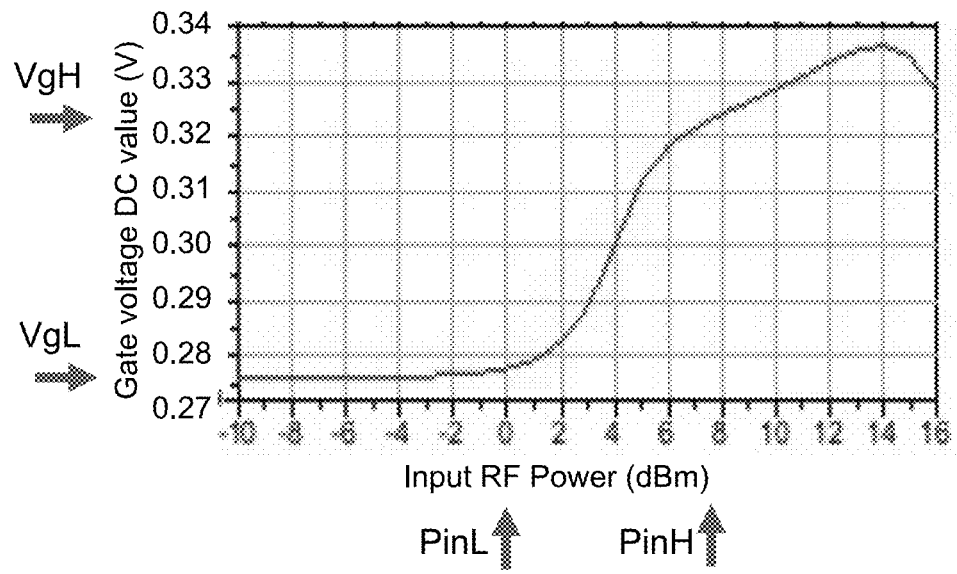
FIGS. 2A and 2B respectively illustrate the variation of DC bias produced by a representative adaptive bias circuit as a function of RF input power to the amplifier in accordance with the invention for nMOS power amplifier FETs and for pMOS power amplifier FETs.
Figure 2B:
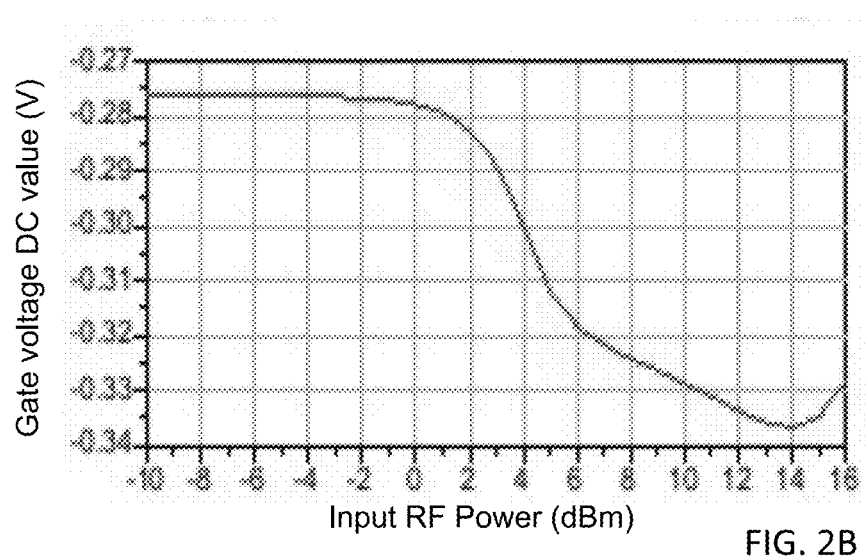

FIG. 2A is a data plot showing representative variation of DC bias of an nMOS power FET gate in response to variation of input power produced with a representative adaptive bias network. For small values of input power, the DC bias voltage is constant, while above a certain input power it the bias voltage increases in a manner that keeps the amplifier gain constant. The amount of bias voltage increase is limited at high power, in accordance with limits for reliability. FIG. 2B is an analogous data plot showing the variation in DC bias voltage produced for use with a pMOS power FET.

Figure 3A:
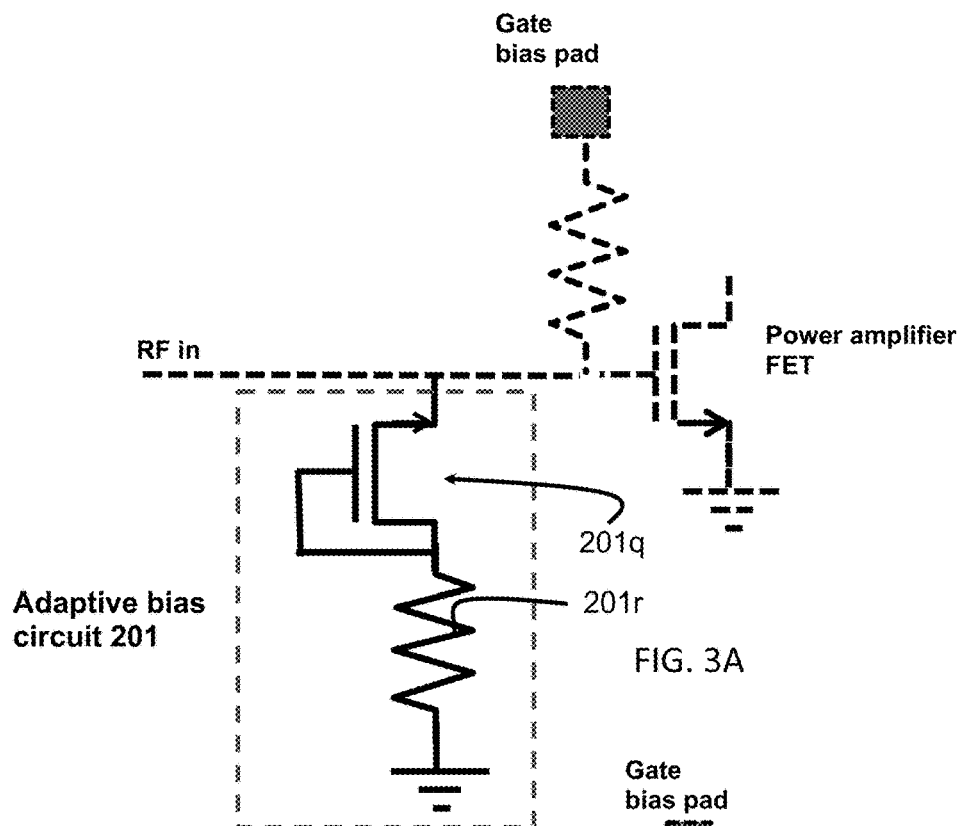
FIGS. 3A, 3B, 3C, and 3D illustrate adaptive bias circuit configurations in accordance with the invention.

A preferred adaptive bias circuit 201 is shown in FIG. 3A, which we refer to as a "basic clamp". The circuit 201 uses a diode connected (drain connected to gate) transistor 201q. The resulting diode anode (for nMOS transistors) can be simply tied to ground through a suitably chosen resistor 201r. The resistor value is adjusted according to the size of the power amplifier FET, in order to provide the flattest gain. When the input RF signal goes sufficiently negative, dc current begins to flow in the gate bias circuit 201, increasing the gate dc bias voltage of the transistor 201q.

Figure 3B:
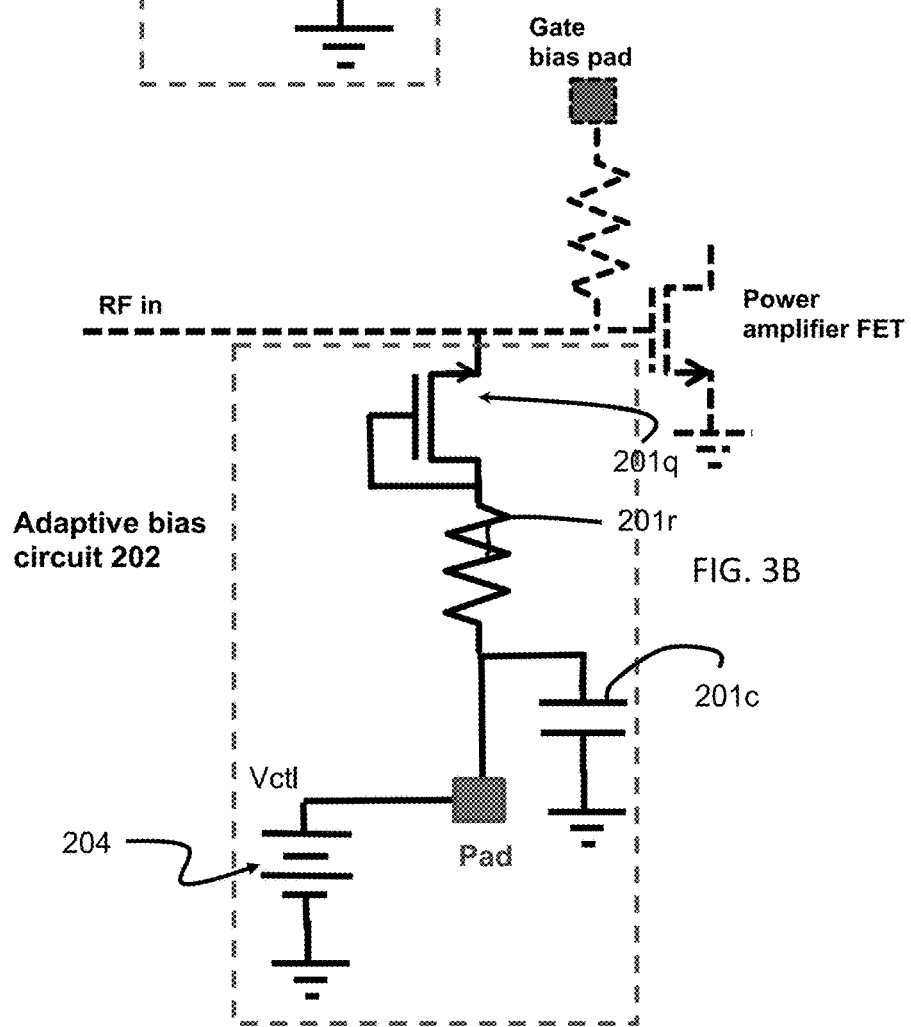

Adaptive bias circuit 202, is shown in FIG. 3B and is similar to the circuit 201, where the basic clamp is tied with a capacitor 201c to ground, but for dc purposes it is connected to a dc source 204 other than ground, which can be provided externally for adjustment purposes, or can be easily generated on-chip through a resistor divider. The circuits 201 and 202 operate with nMOS clamps on nMOS power FETs. Analogous circuits using pMOS transistor clamps can operate on pMOS power FETs. A given power FET can also be controlled with several clamps having different voltage biases and resistors in order to achieve a more complex correction to the gate bias (and thus achieve gain that has very little variation with input power).

The circuits 201, 202 preferably are designed to adjust the gate bias of the power transistor in relation to 4 parameters: 1) target gate voltage VgL at low power, which sets the gain at a low power, typically at least 10 dB below the saturated output power of the amplifier; 2) target VgH at high power, in order to maintain the desired gain at a high power, typically with 1-3 dB of the saturated output power of the amplifier; 3) RF input power PinL at which the Vg adjustment begins, which is dependent on the gain and nonlinearity of the amplifier; and 4) RF input power range over which the adjustment is carried out, which is chosen in relation to the gain variation with power of the uncorrected amplifier. The parameters are illustrated in FIGS. 2A and 2B (where PinH-PinL corresponds to the adjustment range). It is typically desirable to have circuit design methods to control each of the 4 parameters of the adaptive bias network.

For the clamp circuits shown in FIGS. 3A and 3B, these adjustments can be partially controlled by choice of resistor value and (external or internal) voltage control Vctl.

Figure 3C:
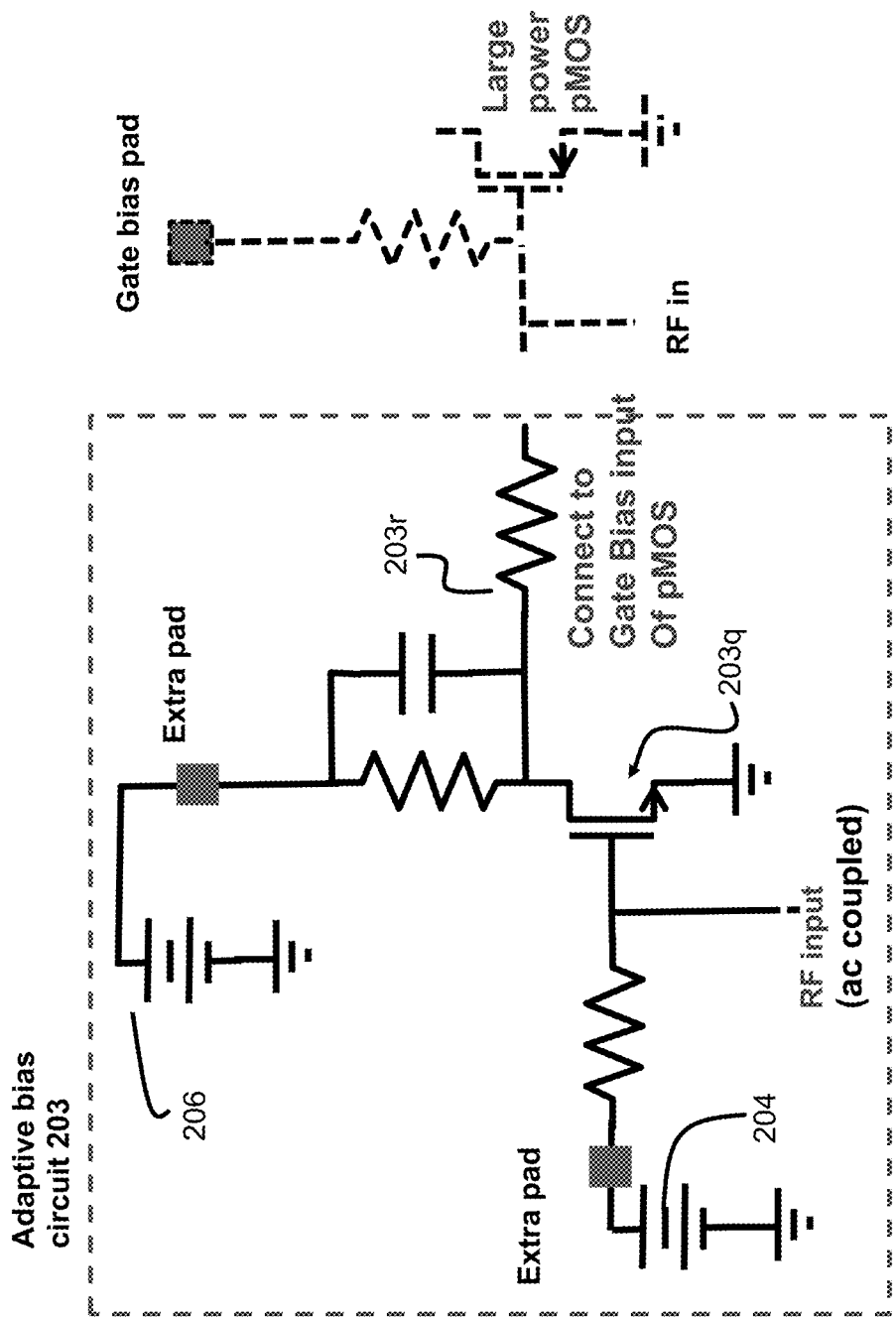

A more complete set of adjustments can be made with the adaptive bias circuit 203 shown in FIG. 3C in which the input signal is rectified using a transistor 203q biased near cutoff by the voltage source 204 connected to the gain of the transistor and a voltage source 206 coupled to the drain of the transistor 203q via a resistor and capacitor, which also provides controllable amplification of the envelope voltage sensed. The adaptive bias circuit 203 is well-suited for connection to a large power pMOS input transistor or input stage transistor because as the rf input to the transistor 203q increases its drain current will increase, and the output voltage of the resistor 203r will become more negative, as desired to increase the current flow of the pMOS power FET. The three resistors and two supply voltages (which can be set with resistor dividers based on system voltage supplies) allow more degrees of freedom for controlling the gate voltage parameters.

All of the adaptive bias circuits described can be used in a single-ended amplifier configuration, or with a differential amplifier configuration. A single adaptive bias network for the bottom transistor may be employed for to provide DC gate voltage control for both sides of a differential amplifier circuit.

Figure 3D:
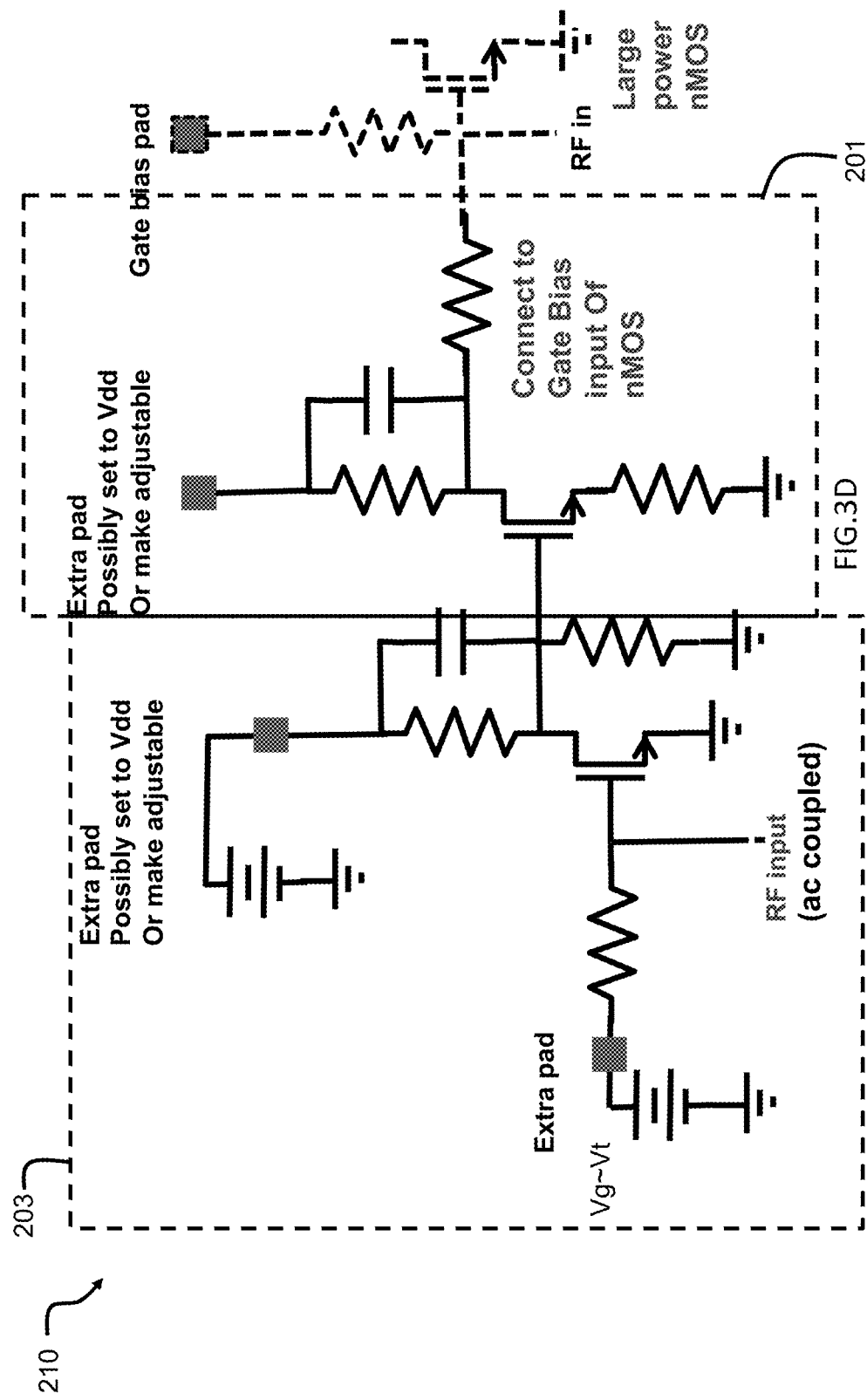

An even more complete set of adjustments is possible with adaptive bias circuit 210 in FIG. 3D, which uses 2 transistor stages with nMOS transistors to control an nMOS power FET. The first transistor stage is biased in Class B or C in order to provide rectification of the rf signal (in a manner similar to the circuit of FIG. 3C), while the second transistor performs amplification as well as inversion of the sign of the gate variation.

There are additional concepts closely related to the above circuits, that are useful to control power FETs that are stacked on top of one another (which is common-place in mm-wave CMOS power amplifiers). Here, the opportunities for linearity improvement are lessened, since the upper transistors in the stack do not significantly control the amplifier current over most of the output power range. A present approach includes the use of the adaptive bias to enhance gain at the uppermost range of output power or to enhance reliability by controlling Vdg excursions in the top transistor of a stack and Vds excursions in the bottom transistor of a stack.

Figure 4:
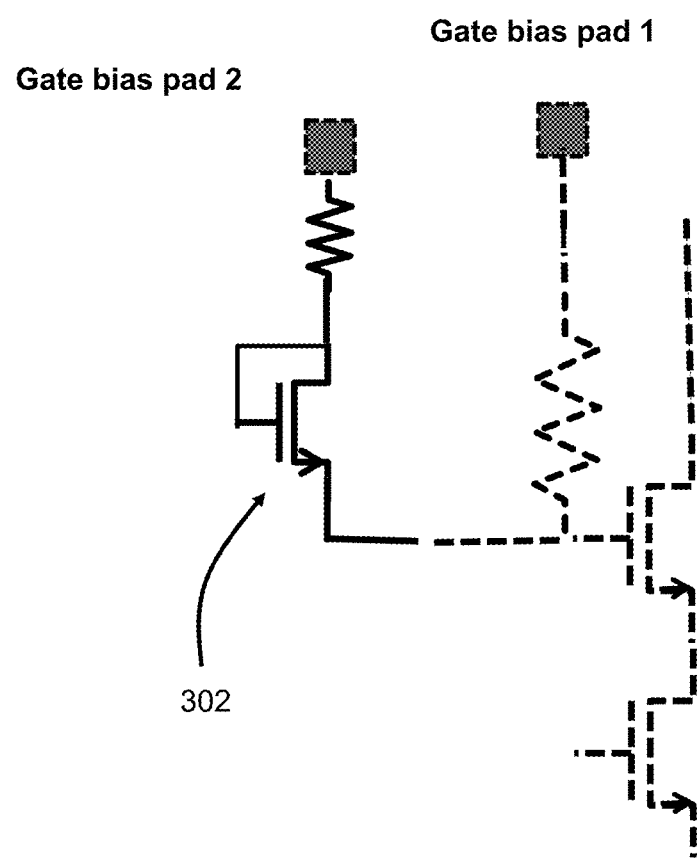
FIG. 4 schematically illustrates application of an adaptive bias circuit in accordance with the invention to a transistor at a higher level in an amplifier stack containing two or more series connected transistors.

FIG. 4 shows a clamp 302 applied to a top transistor in a two-stacked FET nMOS power amplifier. The clamp serves to alter the DC gate voltage of the top transistor in accordance with the input power level, as mirrored in the voltage swing at the drain of the bottom transistor. This improves performance by controlling the drain voltage of the bottom transistor, which is given by the top FET gate voltage less its value of Vgs, when the transistor is on.

Figure 5A:
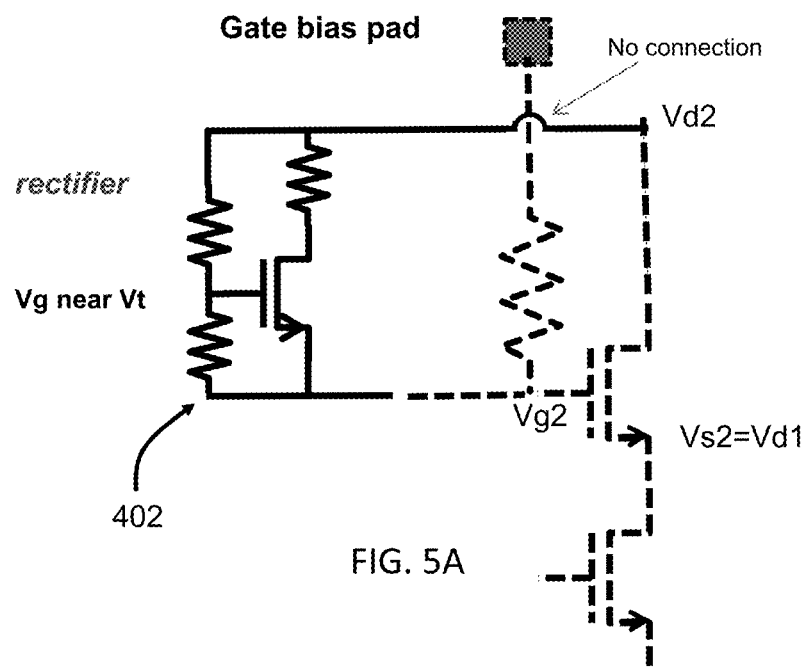
FIGS. 5A and 5B illustrate adaptive bias circuit configurations in accordance with the invention respectively applied to Vg2 and Vg1 to sense Vdg and alter gate bias to Vgs, in a multistack power amplifier.
Figure 5B:
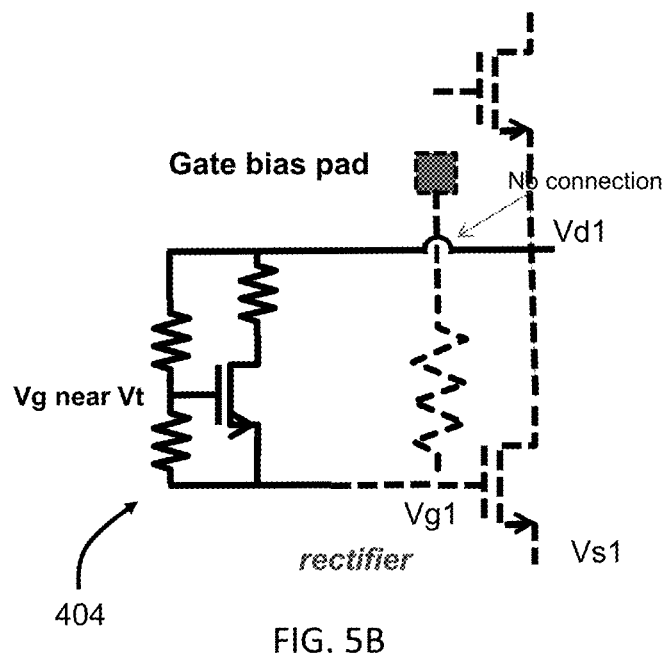

FIGS. 5A & 5B show adaptive bias circuits that use Vdg to directly control gate biases, whereas the circuits 201-203 indirectly adjust gate bias via the input RF power. An adaptive bias circuit 402 directly controls the gate bias of an upper transistor of a transistor stack in an amplifier and an adaptive bias circuit 404 directly controls the gate bias of a lower transistor of a transistor stack in an amplifier. The circuits 402 and 404 are configured as rectifiers by choosing bias resistor such that under conditions of low input power, the gate voltage Vg of the adaptive bias network transistor relative to its source voltage is near the transistor's threshold voltage Vt.

Adaptive bias circuits of the invention have been simulated, and many have been incorporated in the layout of integrated circuits and fabricated. For the adaptive bias circuits 201 and 2022, the "basic clamp" and "adjustable clamp", experimental results have been obtained. The power amplifier circuit was that shown in FIG. 1, implemented with Global Foundries 22FDX CMOS-SOI technology (a slightly modified input impedance matching circuit was used, and an output "accelerator capacitor" was also employed). The adaptive bias circuit clamp circuit 201, with the resistor connected to ground as in FIG. 3A.

Figure 6A:
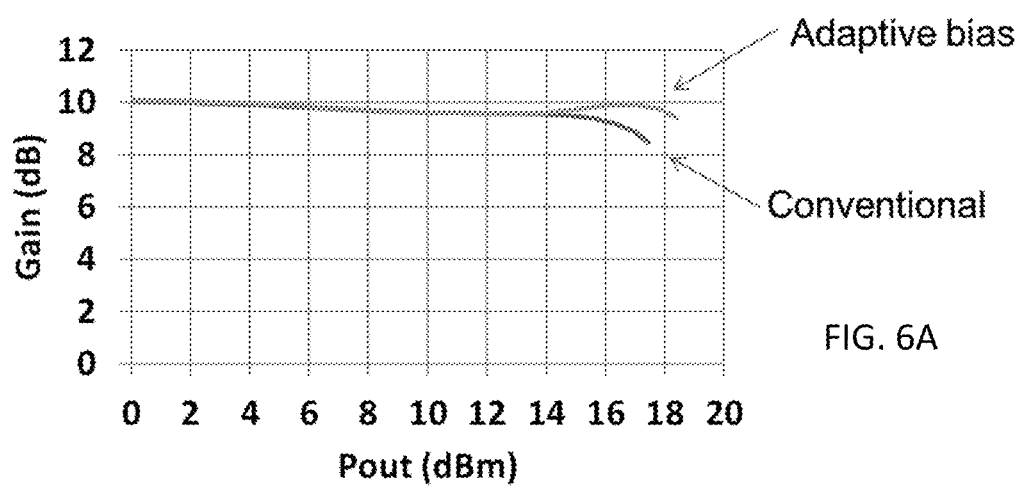
FIGS. 6A and 6B are data plots of experimental gain and phase vs output power for 2-stack power amplifiers using GF 22FDX, with and without adaptive bias circuits of the invention with measurements made at 26 GHz.

FIG. 6A shows the measured gain vs output power for the amplifier with no adaptive bias circuit, and with the adaptive bias circuit. Gain flatness is improved and the extended by 1 to 2 dB to higher power.

Figure 6B:
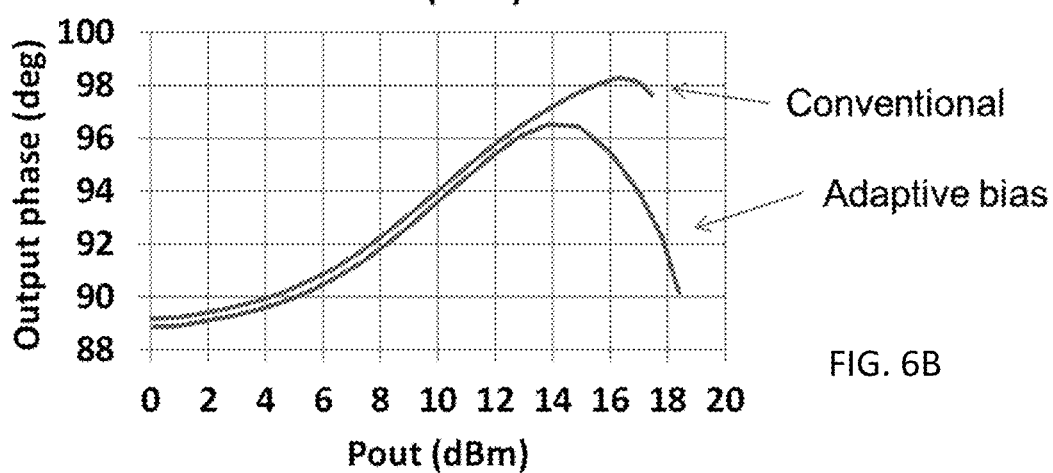

FIG. 6B shows the output phase measured vs output power. With adaptive bias, the maximum phase excursion is decreased, and the average phase excursion is greatly decreased at high power levels.

Figure 7:
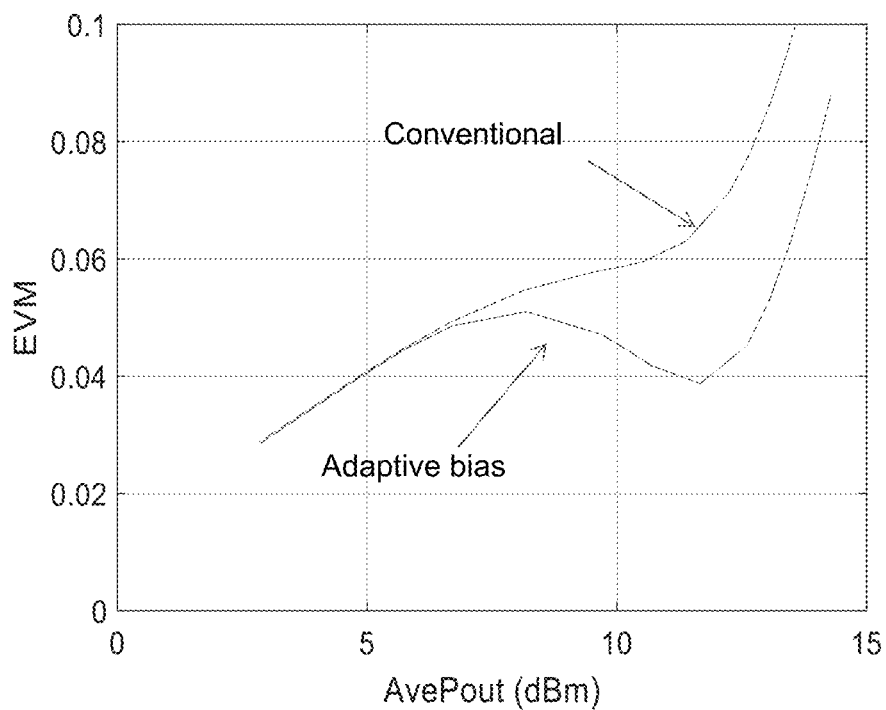
FIG. 7 is a data plot of EVM vs output power for 64QAM OFDM signals computed via matlab based on measured AM-AM and AM-PM curves with and without adaptive bias circuits of the invention.

FIG. 7 show data of simulations of the Error Vector Magnitude (EVM), a critical metric of linearity for 5G applications that is expected for the conventional power amplifier and the one with adaptive bias, for 64QAM OFDM modulations (used in 5G mmwave systems), computed in matlab based on the measured AM-AM and AM-PM curves. A prominent "sweet spot" is visible for the adaptive bias amplifier, considerably decreasing the EVM in the output power range from about 9 dBm to about 14 dBm and allowing for increasing the PA output power and efficiency for the modulated signals.

Figure 8:
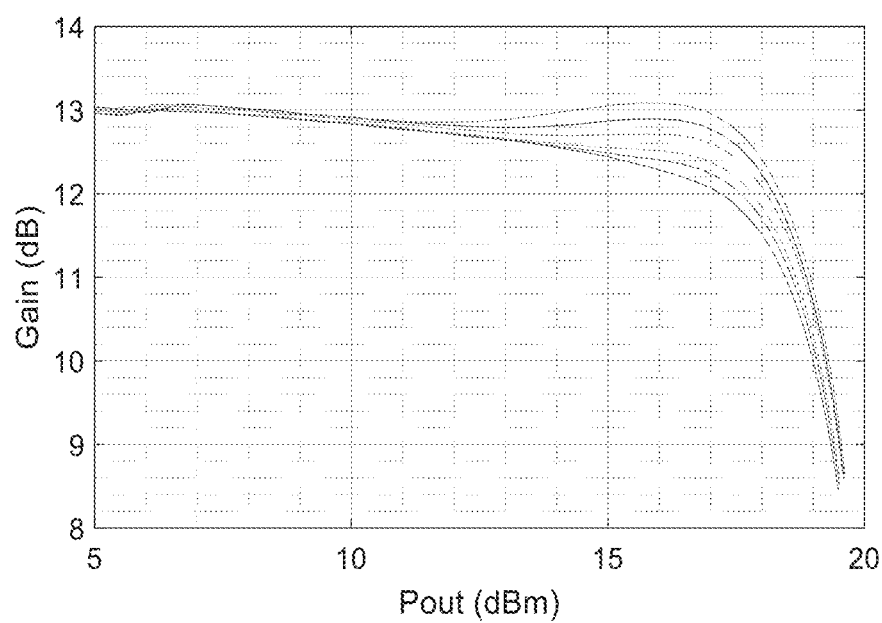
FIG. 8 is a data plot of simulated gain for a 2 stack power amplifier using GF 45 nm CMOS-SOI technology, together with the adaptive bias circuit of FIG. 3B, and external control voltage that is varied from −0.1V (lowest curve) to 0.4V (top curve), in 0.1V steps.

FIG. 8 shows simulated results for an amplifier using the adaptive bias circuit 202, illustrating the gain vs output power with different values of the external voltage (plots range from −0.1V to +0.4V, in 0.1V steps). The boost in gain at the highest output power is seen to be controlled by the external voltage.

Figure 9:
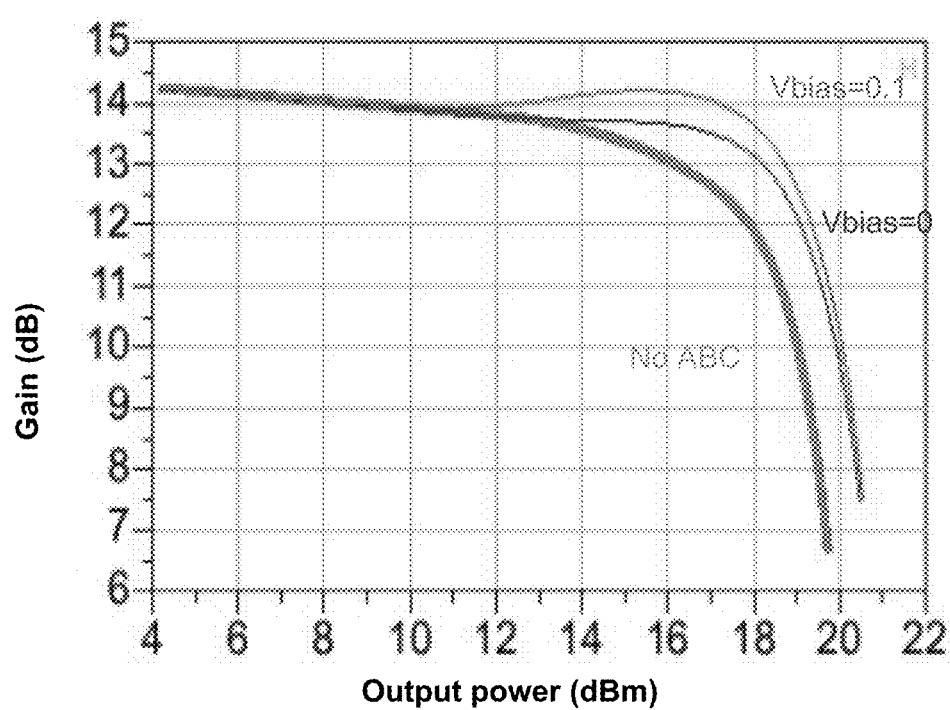
FIG. 9 is a data plot of experimental curves of gain vs output power measured for a 28 GHz power amplifier with the adaptive bias circuit of FIG. 3B.

FIG. 9 shows experimental results for an amplifier implemented in the Global Foundries 45 nm CMOS-SOI technology using the adaptive bias circuit 202, illustrating the gain vs output power with different values of the external voltage (Vbias=0V and +0.1V), and for comparison a circuit with no adaptive bias circuit. The boost in gain at the highest output power is seen to be controlled by the external voltage. The resultant gain is relatively constant over a significantly greater power range than for the uncorrected circuit.

Figure 10:
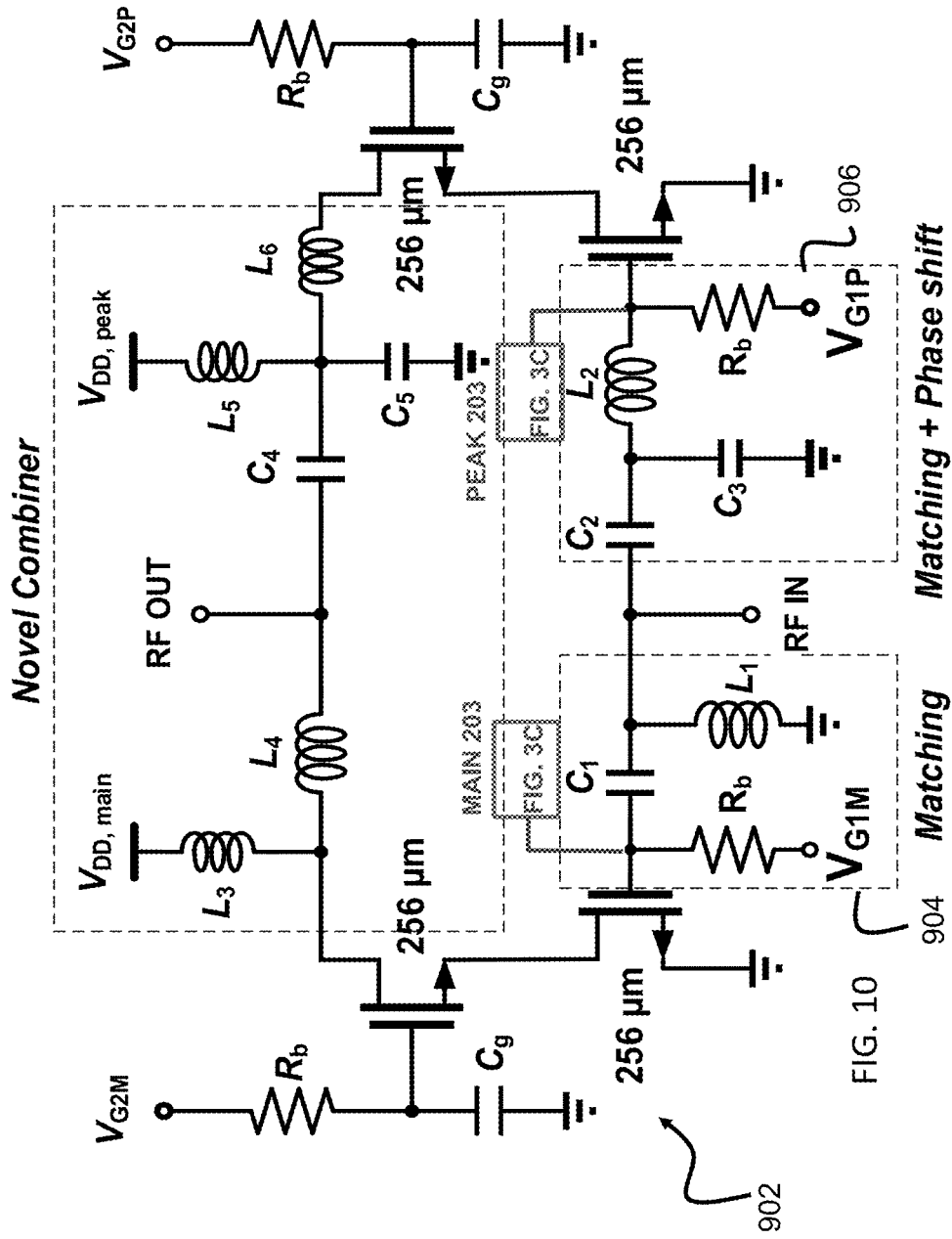
FIG. 10 is a simplified circuit schematic for 28 GHz nMOS Doherty power amplifier showing with both a main and peak adaptive bias circuit of FIG. 3C.

FIG. 10 is circuit diagram of a Doherty amplifier 902 based on MOS power transistors which incorporate adaptive bias circuits 203 of FIG. 3C for main 904 and peak 906 sections of the amplifier 902. The amplifier 902 is designed to provide efficiency at back-off power levels higher than that of conventional amplifiers. Doherty amplifiers typically have considerable gain variation vs power level, and associated poor AM-AM characteristics. The adaptive bias circuits 203 as implemented in FIG. 10 reduce gain variation vs. power level and improve the amplifier's AM-AM characteristics.

Figure 11:
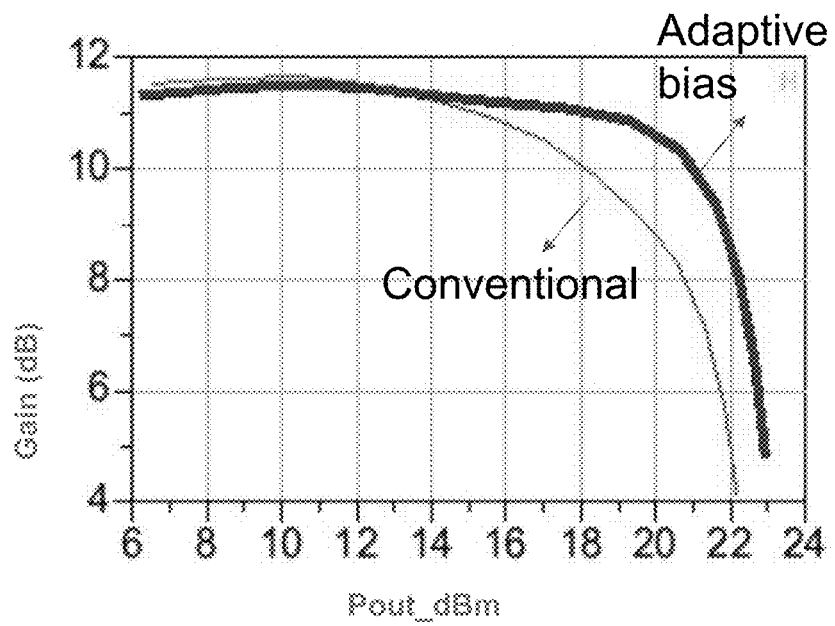
FIG. 11 is a data plot of simulated gain vs output power for a Doherty amplifier (implemented with 45 nm pMOS-SOI FETs) with and without an adaptive bias circuit of the invention.
Figure 12:
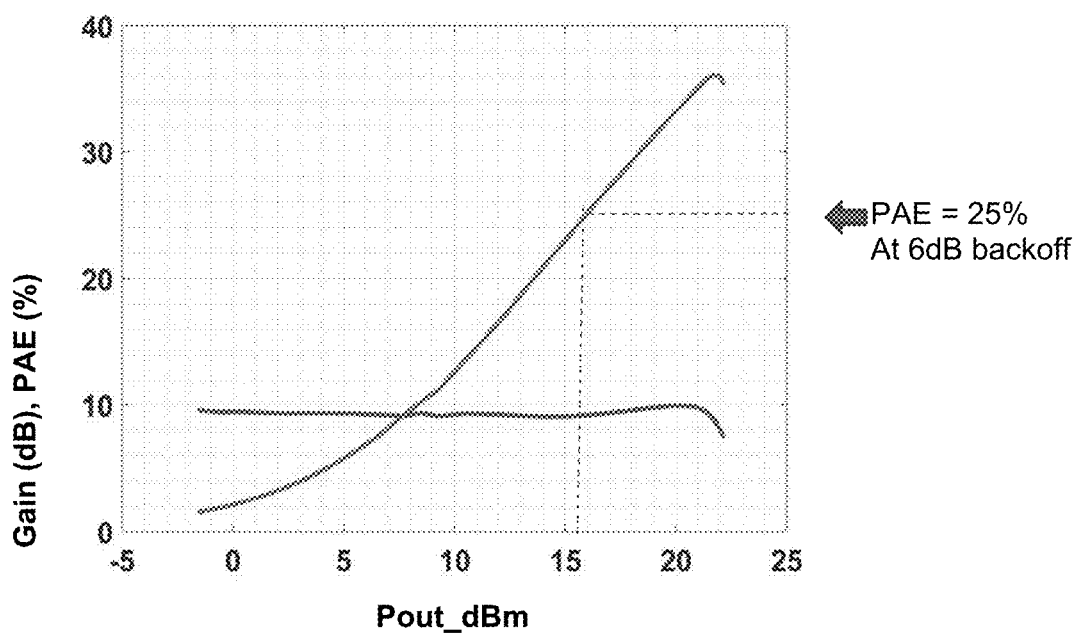
FIG. 12 is a data plot of measured characteristics of pMOS Doherty employing an adaptive bias circuit of the invention illustrating flat gain vs output power along with a high value of PAE at backoff.

Specifically, simulations show that the adjustment provided by the adaptive bias circuits permits realization of flat gain response over a desired output power range, as illustrated in FIG. 11. Experimental results for the pMOS Doherty amplifier with the adaptive bias circuits are shown in FIG. 12, illustrating the flat gain vs output power expected from the simulation, as well as the high power-added efficiency at 6 dB backoff power of 25% expected from a high performance mm-wave Doherty PA.

Minimizing Memory Effect

In order for the adaptive bias networks to be effective in improving the overall amplifier linearity including AM-AM and AM-PM characteristics of the amplifier for modulated signals, it is important that the variation of gate bias voltages be produced with a short enough response time to be able to follow the varying amplifier power associated with the modulation. If the adaptive bias network responds too slowly, the bias voltage that it generates will be determined by the input power at an earlier time, not the bias voltage needed at the proper instant. In the case of slow response, the response time lag corresponds to a "memory effect" which causes errors in the amplifier output amplitude and phase responses.

Figure 13B:
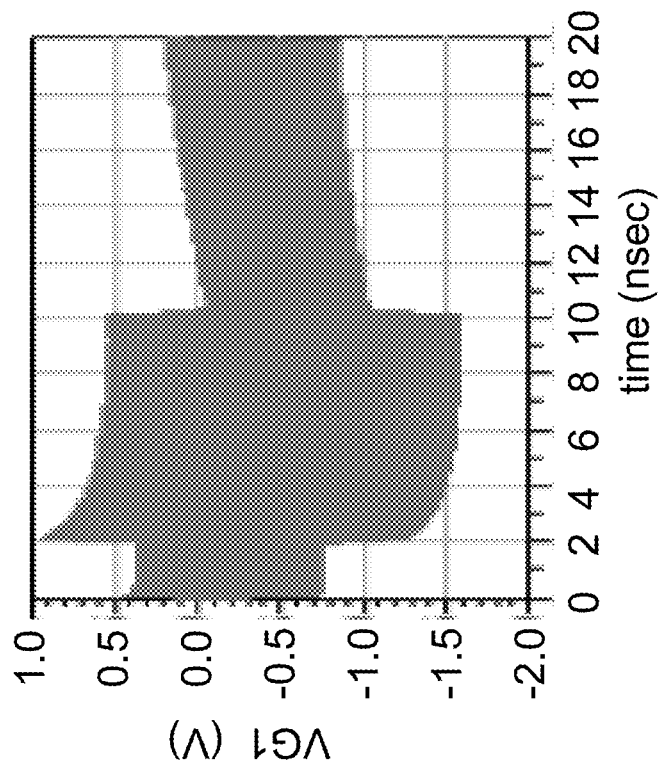
FIGS. 13A-D are representative waveforms of RF input signal and of gate voltage of an output power FET, for a choice of R,C values that produce slow response (memory effect) (FIGS. 13A-13B); and a choice of R,C values that provide faster response (FIGS. 13C-13D)
Figure 13A:
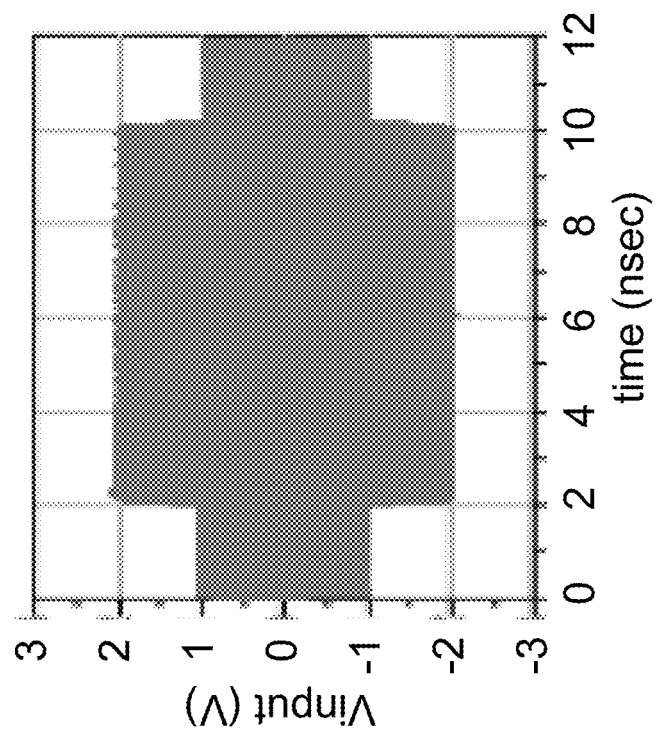

The effect is illustrated in the simulations shown in FIGS. 13A-13D. Here the amplifier input is chosen to be a sinusoidal signal at 28 GHz, which undergoes a sudden step increase in amplitude, followed later by a sudden decrease in amplitude (FIG. 13A); the variation at 28 GHz is so fast that the sinewaves are blurred into a solid figure, but the modulation amplitude is clearly visible. The corresponding variation of the gate input signal for an adaptive bias circuit exhibiting memory effect is shown in FIG. 13B. The gate voltage amplitude does not accurately follow changes in RF input amplitude; it exhibits a slow transient over 2-4 ns in response to the increase in amplitude, and another transient (with a longer time constant, 4-8 ns) in response to the decrease in input amplitude. High frequency components of the input modulation will experience an incorrect response of the adaptive bias network. The maximum modulation bandwidth $BW_{max}$ that can be supported with full accuracy is of the order of $BW_{max}=1/(2\pi\tau)$, where t is the (longest) time constant of the circuit response. As examples, for $\tau=2$ ns, BWmax=80 MHz; for $\tau=8$ ns, $BW_{max}=20$ MHz.

Figure 13D:
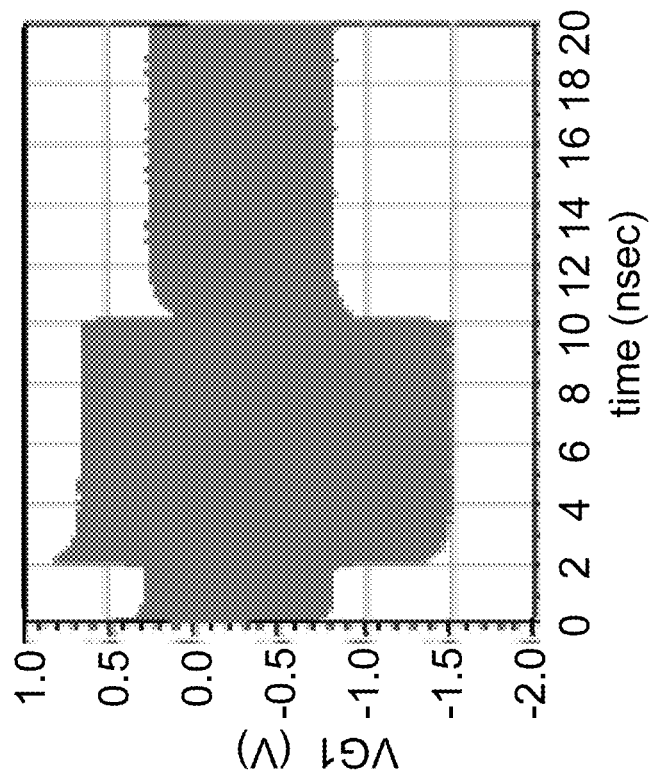
Figure 13C:
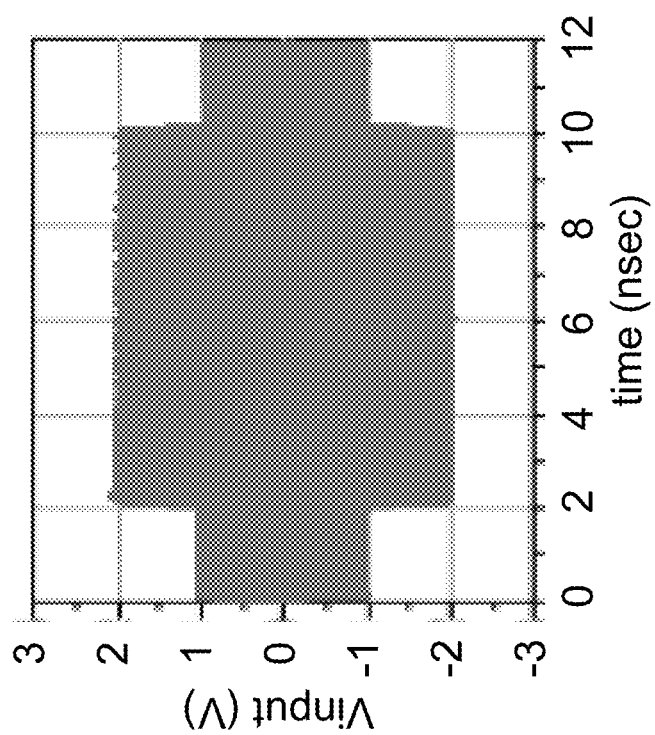

To minimize the memory effect errors, it is important that the response speed of the adaptive bias networks be increased to an extent consistent with the bandwidth of the modulation used. The primary determining factors of the response speed of the adaptive bias networks described here are the resistance R and capacitance C values chosen in the circuits. Small values of the RC time constant lead to faster response. It is noteworthy that the effective transistor resistance (or current vs input voltage) is also a contributor, which leads to the difference between time constants on rising and falling edges. FIGS. 13C and 13D show behavior that reduces the memory effect considerably, using smaller choices of R and C. In general, it is desirable to select RC values appropriate to the modulation bandwidth BW, since with lower RC a somewhat larger amount of input power must be spent in driving the adaptive bias network, reducing the overall amplifier gain.

Minimizing AM-PM Distortion with a Varactor

The above described adaptive bias circuits can include a varactor to decrease amplifier AM-PM distortion. In the following discussion, a "varactor" is a device for which capacitance depends on applied voltage. A varactor can be realized with a diode or a transistor in example circuits of the invention.

Figure 14:
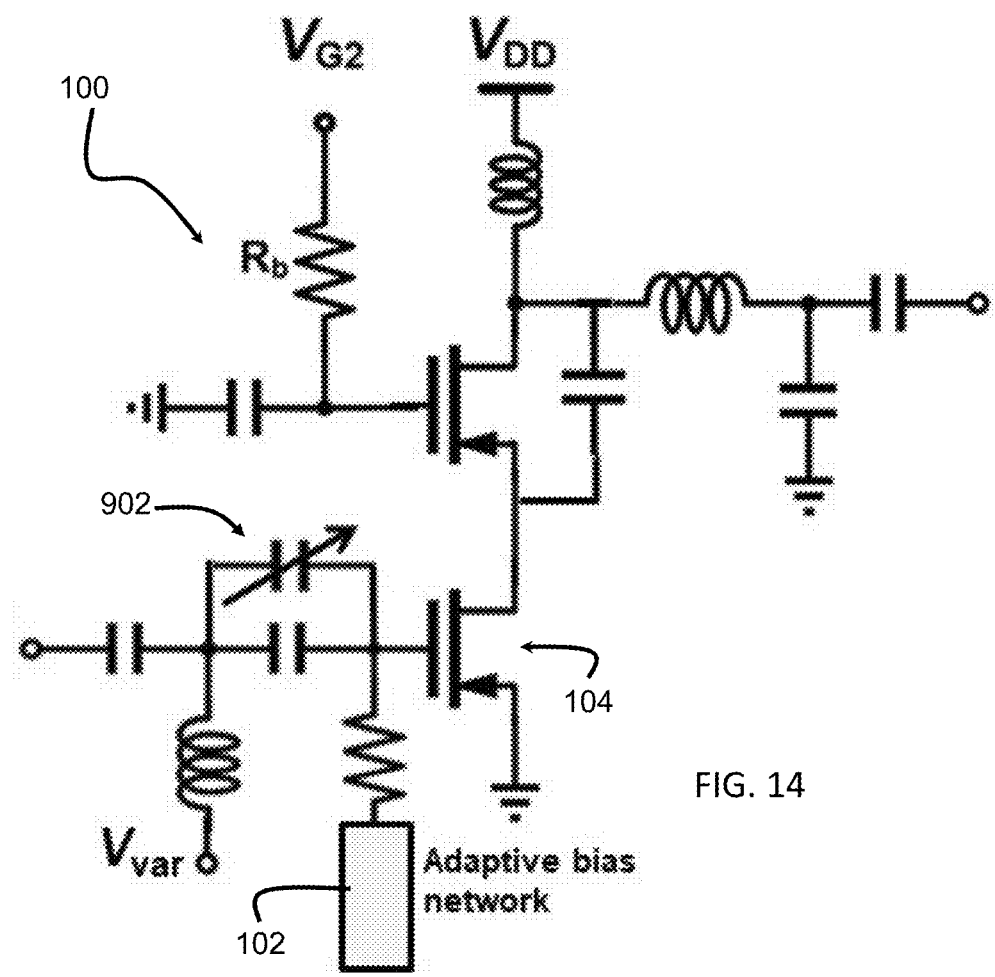
FIG. 14 is a mm-wave amplifier schematic of the invention, indicating the use of a varactor in the input matching circuit to mitigate AM-PM distortion.

FIG. 14 shows a modification of the FIG. 1 mm-wave power amplifier 100 to include a varactor 902. The capacitance of the varactor 902 varies in accordance with the DC voltage across it. This voltage is modified by the use of an adaptive bias network 102 attached to the gate of the bottom FET, as needed to also minimize AM-AM distortion. It should be understood in the diagram that the adaptive bias network is connected to ground and additional supplies to provide the required gate voltage vs input power relationship. The varactor 902 is in series with the gate of the input FET 104, and is optionally placed in parallel with a conventional fixed capacitor to assist in adjusting the overall capacitance for proper tuning of the input impedance matching network. A conventional Class AB nMOS amplifier circuit without the adaptive bias network 102 employs a fixed capacitor in the location of the varactor 902 for input impedance matching in high output power amplifiers (or in related input matching circuits). With an appropriately selected varactor capacitance, the same input impedance matching can be achieved under conditions of low input power, and at higher input power, the changing varactor capacitance maintains a proper input match, compensating the changes in transistor input capacitance with power level.

Figure 15:
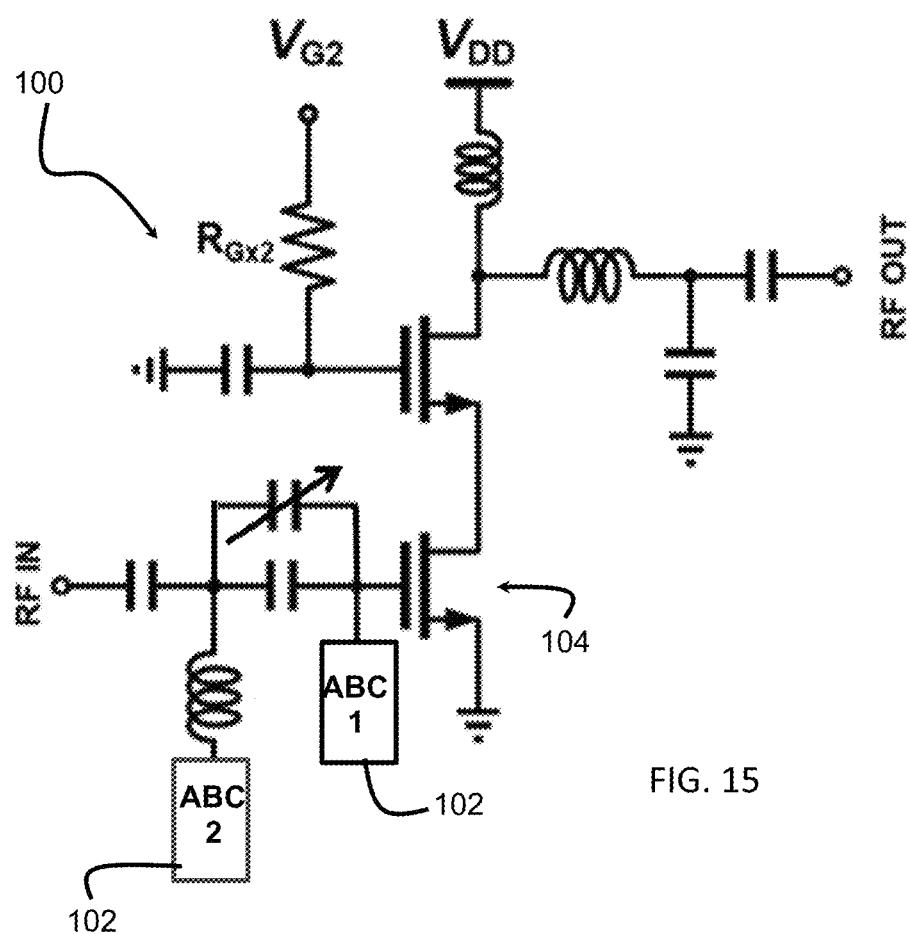
FIG. 15 is mm-wave amplifier schematic of the invention, indicating the use of a varactor in the input matching circuit to mitigate AM-PM distortion, including also two adaptive bias circuits (ABC_1 and ABC_2) that provide dc voltages that vary according to input power.

The varactor 902 can be implemented as a transistor with drain and source terminals shorted together and in a preferred embodiment uses a compact layout with double-sided gate contacts (to minimize series resistance). The varactor capacitance varies as a function of voltage across the device. In the present adaptive bias adjusted amplifier circuits, the voltage across the varactor 902 is varied in accordance with the RF input power level, by using an adaptive bias network on one or both sides of the varactor as shown in FIG. 15, leading to a controlled change in capacitance as a function of the RF input signal amplitude.

The principal cause of AM-PM distortion in many power amplifiers is the change in capacitance of the input power FET 104 as a function of input power. The capacitance change of the varactor 902 generated by the adaptive bias network 102 is chosen to compensate the change in the input capacitance of the power FET, thereby mitigating the AM-PM distortion. If the FET input capacitance increases as the input power increases, then the varactor capacitance is configured to decrease as a function of input power and vice versa. AM-PM distortion can be considered in a simplified manner to be the result of the phase variation of the voltage across the FET input capacitance Cin; this voltage determines the amplitude and phase of the transistor output current. Analytical calculations show that the corresponding phase is controlled by the value of the series capacitance combination (CinCvar/(Cin+Cvar)), which in turn can be made to nearly invariant as the Cin varies as a function of input voltage swing.

A preferred design of the input impedance matching circuit, the adaptive bias network and the choice of varactor takes into account the fact that the varactor capacitance changes over a varactor voltage range of ~0.5V. The FET input capacitance changes as the input voltage changes over a range up to 1.5-2.0V. For optimal utilization of the varactor capacitance change, it is appropriate to arrange for a voltage divider relationship between the FET and varactor so that the voltage swing on the varactor is lower than that across the FET by a factor of order 3×.

In the circuit of FIG. 14, one adjustable bias network is used to improve the AM-AM characteristics by controlling the gate voltage of the bottom FET in accordance with the rf input power, and at the same time to vary the DC voltage across the varactor to improve the AM-PM characteristics. This results in a simple circuit, but may require tradeoffs in the design of the varactor or compromise either AM-AM or AM-PM optimization. The circuit of FIG. 15 employs two adaptive bias networks, in order to allow relatively independent control of the gate bias vs input power, and varactor DC voltage vs input power.

The AM-PM compensation circuits can also be employed in differential amplifier configurations (e.g., with a separate varactor for each of the branches of the differential PA).

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method of AM-AM and/or AM-PM compensation in a RF amplifier operating at frequency above 20 GHz, the method comprising receiving an RF signal at a matching network connected to a power FET of the RF amplifier, sensing the RF power level of the RF signal with an adaptive bias circuit in the matching network, and adjusting, via the adaptive bias circuit, a gate bias voltage Vg of the power FET as a function of the instantaneous RF power level of the RF signal, wherein the adjusting comprises directly adjusting a gate bias of the power FET via a transistor that senses the drain to gate voltage of the power FET.

2. The method of claim 1, wherein the adjusting comprises boosting gate bias voltage in a high region of the RF input power level (for an nFET power transistor) or decreasing gate bias voltage in a high region of the RF input power level (for a pFET power transistor).

3. The method of claim 2, wherein the adjusting is conducted to meet one or more of the following parameters: 1) target gate voltage VgL at low power; 2) target gate voltage VgH at high power; 3) RF input power at which the gate bias voltage Vg adjustment begins; and 4) RF input power range over which the gate bias voltage Vg adjustment is carried out.

4. The method of claim 1, wherein the power FET is at the bottom of a multistack RF amplifier.

5. The method of claim 1, wherein the RF amplifier is a multi-stage amplifier and the power FET is at the bottom of a multistack stage of the RF amplifier.

6. The method of claim 1, wherein the adaptive bias circuit comprises a bias resistor configured such that its gate voltage relative to its source voltage is near its threshold voltage Vt under conditions of a low level of the RF power level.

7. The method of claim 1, wherein the adjusting comprises rectifying the RF signal with a diode-connected transistor or a diode.

8. The method of claim 1, where the adaptive bias network is designed to respond with a small enough time constant to be able to follow the envelope power variations of a modulated signal.

9. The method of claim 1, wherein the power FET is in a stack of power FETs.

10. A RF power amplifier operating at a frequency above 20 GHz, comprising an input matching network that receives a RF signal; a power FET connected to the input matching network and an adaptive bias circuit in the input matching network that senses RF power of the RF signal and adjusts gate bias voltage of the power FET in a prescribed increasing function of instantaneous RF power level of the RF signal, wherein the adaptive bias circuit comprises a diode-connected transistor connected to a gate of the power FET and through a resistor to ground.

11. The RF power amplifier of claim 10, wherein the adaptive bias circuit comprises a diode-connected transistor connected to the gate of the power FET and through a capacitor to an AC ground and through a resistor to a DC source.

12. The RF power amplifier of claim 10, comprising more than one adaptive bias circuit stage in the input matching network.

13. The RF power amplifier of claim 10, wherein the adaptive bias circuit is configured to change the gate voltage of the power FET in a way that reduces the magnitude of its drain-to-gate voltage whereby the reliability of the power FET is increased.

14. A RF power amplifier operating at a frequency above 20 GHz, comprising an input matching network that receives a RF signal; a gate power FET connected to the input matching network: an adaptive bias circuit in the input matching network that senses RF power of the RF signal and adjusts gate bias voltage of the power FET in a prescribed increasing function of the instantaneous RF power level of the RF signal; and a varactor in the input matching network arranged such that varactor capacitance is controlled by the variation of the dc voltage across it, wherein the dc voltage is generated by the adaptive bias circuit connected to the gate or a different adaptive bias circuit.

15. The RF power amplifier of claim 14, wherein the varactor is in series with the gate of the power FET to compensate for a changing input capacitance of the power FET in response to the RF signal.

* * * * *